(12) United States Patent
Kazarinov et al.

(10) Patent No.: US 6,882,666 B2
(45) Date of Patent: Apr. 19, 2005

(54) KINK FREE OPERATION OF PUMP LASERS HAVING DIFFRACTION GRATING FOR PROVIDING WAVELENGTH STABILIZATION

(75) Inventors: Rudolf Kazarinov, Sedona, AZ (US); Sergey Frolov, Berkeley Heights, NJ (US); Joseph Shmulovich, New Providence, NJ (US)

(73) Assignee: Inplane Photonics, Inc., South Plainfield, NJ (US)

( * ) Notice: Subject to any disclaimer, the term of this patent is extended or adjusted under 35 U.S.C. 154(b) by 0 days.

(21) Appl. No.: 10/277,999

(22) Filed: Oct. 22, 2002

(65) Prior Publication Data

US 2004/0076208 A1 Apr. 22, 2004

(51) Int. Cl.$^7$ ................................................ H01S 3/13
(52) U.S. Cl. .............................. 372/29.013; 372/29.01; 372/29.015; 372/43; 372/44; 372/46; 372/92
(58) Field of Search .............................. 372/43, 44, 46, 372/92, 29.01, 29.013, 29.015, 87, 81

(56) References Cited

U.S. PATENT DOCUMENTS

| | | | | |
|---|---|---|---|---|
| 4,562,569 A | * | 12/1985 | Yariv et al. | 369/122 |
| 5,023,878 A | * | 6/1991 | Berthold et al. | 372/20 |
| 5,056,100 A | | 10/1991 | Vahala et al. | 372/50 |
| 5,440,577 A | | 8/1995 | Tucker | 372/50 |
| 5,614,436 A | | 3/1997 | Shim et al. | 437/129 |
| 5,799,024 A | * | 8/1998 | Bowers et al. | 372/11 |
| 6,031,851 A | * | 2/2000 | Shimizu et al. | 372/18 |
| 6,044,093 A | | 3/2000 | Ventrudo et al. | 372/6 |
| 6,215,809 B1 | | 4/2001 | Ziari et al. | 372/96 |
| 6,625,192 B1 | * | 9/2003 | Arbel et al. | 372/69 |

OTHER PUBLICATIONS

Kam Y. Lau; Chapter 5, "Quantum Well Lasers"; New York: Academic Press, 1993; pp. 217–275.*

Lau, Kam Y., *Quantum Well Lasers*, Chapter 8, "The QW Gain–Lever Effect,", ed. Peter S. Zory, Jr., Academic Press, 1993, pp. 252–255.

Temkin Henryk et al., "Reflection Noise in Index–Guided InGaAsP Lasers," IEEE Journal of Quantum Electronics, vol. QE–22, No. 2, Feb. 1986, pp. 286–293.

Achtenhagen, Martin et al., "L–I Characteristics of Fiber Bragg Grating Stabilized 980–nm Pump Lasers," IEEE Photonics Technology Letters, vol. 13, No. 5, May 2001, pp. 415–417.

Pham, Guillaume et al., "Self–Pulsation in Two–Section DFB Semiconductor Lasers and Its Synchronization to an External Signal," IEEE Journal of Quantum Electroncis, vol. 34, No. 6, Jun. 1998, pp. 1000–1008.

Kam K. Lau, Chap. 5, "Dynamics of Quantum Well Lasers." *Quantum Well Lasers* (New York: Academic Press, 1993), pp. 217–275.

* cited by examiner

*Primary Examiner*—Wilson Lee
*Assistant Examiner*—Leith Al-Nazer
(74) *Attorney, Agent, or Firm*—Mayer Fortkort & Williams, PC; Stuart H. Mayer, Esq.

(57) ABSTRACT

A semiconductor laser source includes a laser diode having front and rear facets. The laser diode includes a substrate and a lower cladding layer disposed on the substrate. The lower cladding layer is doped with a dopant of the first conductivity type. An active layer is disposed on the lower cladding layer and an upper cladding layer is disposed on the active layer. The upper cladding layer is doped with a dopant of the second conductivity type. At least one electrode is disposed on a first outer layer of the diode. A pair of electrodes is disposed on a second outer layer of the diode. The second outer layer is located on a side of the diode opposing the first outer layer. The pair of electrodes is configured to allow application of different currents to each one of the electrodes in the pair of electrodes. A reflector, which is located external to the laser diode, is in optical communication with the front facet of the laser diode for providing optical feedback to the active region.

79 Claims, 3 Drawing Sheets

KINK FREE OPERATION OF PUMP LASERS HAVING DIFFRACTION GRATING FOR PROVIDING WAVELENGTH STABILIZATION

FIELD OF THE INVENTION

The present invention is a laser source that provides high power optical radiation with control and stabilization of wavelength and intensity sufficient for the optical pumping of rare-earth doped amplifiers in fiber-optical applications.

BACKGROUND OF THE INVENTION

Semiconductor laser diodes are essential components for optical amplifier systems of the kind expected to fulfill the increasing requirements of rapid and large capacity communications. In particular, the increasing density of communications channels in dense wavelength division multiplexing (DWDM) operation requires increased power and an ever-tighter degree of control of fiber amplifier gain flatness. This, in turn, relates to the power capacity, wavelength stability and control of the pump diode laser. In this context an essential component of diode performance is a smooth dependence of output light intensity L on injection current input I over their complete range of operation.

From the earliest days it was apparent that diode lasers were highly susceptible to optical feedback induced by reflections from outside the laser cavity. However, it was soon found that under proper control, such as coupling a portion of the diode output back into the laser cavity in a controlled manner by use of external mirrors or gratings, this initially undesirable property could be used to advantage. Although a complete description of the possible ranges of behavior as a function of current modulation and feedback intensity is extremely complex, stable narrow-linewidth single-mode operation has successfully been obtained in external cavity lasers both in the weak and strong feedback regimes. In both these categories several device configurations have been developed with laser linewidths as low as a few kHz and with continuous wavelength tunings in excess of 100 kHz. However, in an intermediate-intensity feedback regime between these two ranges of stable single mode stability, a lack of coherence develops between the diode cavity field and the reflected field. As a consequence the linewidth dramatically broadens and the laser undergoes transition to a regime referred to in the literature as a 'coherence collapsed' state.

If controlled feedback is provided by free-standing mirrors or gratings then additional optical elements are usually required to manipulate and guide the light. A great simplification can be effected in this regard by using for the reflecting element a fiber Bragg grating (FBG) written into the output fiber itself. If the wavelength of maximum grating reflectivity is selected to lay near the peak of diode bandwidth then the Bragg grating locks the diode cavity output to the Bragg wavelength of the grating. This locking results in a reduction of output noise, an increase in side-mode suppression and an increase of laser stability. In principle, an external cavity feedback laser should serve as an efficient high power single mode optical source if operated in the strong feedback regime (for which the front facet of the laser is given an antireflective coating to enable the grating feedback to be comparable to or larger than the front facet feedback). In practice, however, the single mode stability of the laser disappears in dramatic fashion with even modest degrees of modulation of the injection current. The source can be traced to the fact that the refractive index n of the diode material is sensitive to the value of the injection current, primarily (though not solely) via an induced generation of heat and the resulting change of temperature T. Since the magnitude of the temperature dependence of refractive index dn/dT of a typical diode laser semiconductor material is at least an order of magnitude larger that that of the FBG material (silica), the temperature dependence of the laser cavity modes (about 0.1 nm/C) far exceeds that of the Bragg wavelength (about 0.01 nm/C) even if the grating experiences the full current-induced temperature variations. The result is a breakdown of mode locking with current modulation. In single mode strong feedback operation, using antireflective coating, the laser operates with a typical mode separation of about 0.1 nm. For a mode spacing of this order, the above mechanism leads to a separate destabilizing mode-hopping event for about every 1 C of temperature change.

In a typical external cavity diode laser the fiber Bragg grating spliced into the output fiber possesses a reflection spectrum equal to approximately 5–6 spacings of the laser cavity centered, say, at a wavelength $\lambda_0$. If the distance between the FBG and the diode laser cavity is smaller than the coherence length of the laser without feedback then single mode Fabry-Perot (FP) operation can be stabilized by constructive interference between reflection from the laser front facet and the grating. The pump wavelength is then associated with one of the laser FP modes within the grating reflection spectral range. However, with increasing injection current the temperature of the active region rises and, as a consequence of the large difference in dn/dT between the semiconductor and glass, the laser FP modes redshift relative to $\lambda_0$ inducing a series of laser wavelength jumps from one FP mode to another. These jumps result in kinks in the L-I curve. An example is shown in FIG. 1 (taken from M. Achtenhagen, S. Mohrdiek, T. Pliska, N. Matuschek, C. C. Harder, and A. Hardy, IEEE Photonics Technology Letters Vol. 13, pp415–417) where the associated power fluctuations are also depicted in a more detail as derivatives (i.e. the efficiency) dL/dI as a function of I.

Kinks of this kind are severely detrimental to laser operation and solution has been sought either by dithering the driving current (M. Ziarri et al. "Stabilization of Laser Sources with Closely-Coupled Optical Reflectors using an Internal Dither Circuit", U.S. Pat. No. 6,215,809) or by removing the FBG to distances beyond the coherence length of the laser (see, for example, B. F. Ventrudo and G. Rogers, "Fibre-Grating-Stabilized Diode Laser", U.S. Pat. No. 6,044,093). In the latter case, for which distances are typically of order 50 to 100 cm, the reflection can no longer interfere constructively and the feedback from the FBG breaks the coherence of the diode laser emission. In either case the pump laser undergoes power fluctuations that keep the laser in a transient multimode regime—the regime of so-called coherence collapse (see 'Reflection Noise in Index-Guided InGaAsP Lasers' by H. Temkin, N. Anders Olssen, J. H. Abeles, R. A. Logan and M. B. Panish, IEEE J. Quantum Electronics, Vol. 22, pp. 286–293). In this multimode regime the light intensity depends on current continuously, eliminating the L-I kinks of single-mode operation. However, the maximum optical power obtained in this regime is substantially lower than that of single mode operation. A schematic representation of the prior art, as illustrated by an external cavity laser with remote FBG, is shown in FIG. 2. The figure comprises a laser source 203, such as a semiconductor laser diode, optically coupled via front facet 201 to an optical fiber waveguide 206. The laser source 203 has an active region 202, which is pumped by means of a supply current 205 via electrodes 204. A Bragg grating 207, written into the fiber waveguide 206, is positioned at a distance from the diode cavity front facet 201 sufficiently large that no constructive interference can take place. With facet 201 given an antireflective coating, the Bragg grating now effectively forms the front facet of the external cavity laser so formed, and induces operation in a 'coherence collapsed' kink free state. This approach to pump diode lasers is widely used. However, it has a number of disadvantages. First, the maximum power of operation is still limited by instability due to kinks and low frequency noise. Second, such a design is not compact, and, additionally, it requires special grating arrangements for different laser designs.

Accordingly, it would be desirable to provide a laser source that overcomes the aforementioned disadvantages.

SUMMARY OF THE INVENTION

In accordance with the present invention, a semiconductor laser source is provided that includes a laser diode having front and rear facets. The laser diode includes a substrate and a lower cladding layer disposed on the substrate. The lower cladding layer is doped with a dopant of the first conductivity type. An active layer is disposed on the lower cladding layer and an upper cladding layer is disposed on the active layer. The upper cladding layer is doped with a dopant of the second conductivity type. At least one electrode is disposed on a first outer layer of the diode. A pair of electrodes is disposed on a second outer layer of the diode. The second outer layer is located on a side of the diode opposing the first outer layer. The pair of electrodes is configured to allow application of different currents to each one of the electrodes in the pair of electrodes. A reflector, which is located external to the laser diode, is in optical communication with the front facet of the laser diode for providing optical feedback to the active region.

In accordance with one aspect of the invention, a first portion of the active region located between the at least one electrode and a first electrode in the pair of electrodes is forward biased to provide optical gain, while a second portion of the active region located between the at least one electrode and a second electrode in the pair of electrodes is reverse biased to provide optical absorption.

In accordance with another aspect of the invention, the electrodes in the pair of electrodes are electrically isolated from one another by an electrical resistance greater than about 10 Ohms.

In accordance with another aspect of the invention, the laser diode generates optical energy at a wavelength sufficient to pump a rare-earth doped optical amplifier.

In accordance with another aspect of the invention, the active region comprises a multi-quantum well region.

In accordance with another aspect of the invention, the reflector comprises a Bragg grating optically coupled to the output facet for reflecting a portion of optical power back to the active region.

In accordance with another aspect of the invention, the second portion of the active region is reverse-biased to produce instability in a single mode laser operation resulting in self-pulsation.

In accordance with another aspect of the invention, a ratio of current applied to the second electrode to current applied to the first electrode exceeds a relative amount of gain compression arising in the laser diode.

In accordance with another aspect of the invention, the pair of electrodes are disposed on the upper cladding layer and the at least one electrode is disposed on the substrate.

In accordance with another aspect of the invention, the at least one electrode is a single, electrically continuous electrode.

In accordance with another aspect of the invention, the first conductivity type is n-type and the second conductivity type is p-type.

In accordance with another aspect of the invention, the laser diode and the reflector are located on a common planar lightguide circuit.

In accordance with another aspect of the invention, a planar waveguide is formed on the common planar light circuit coupling the reflector to the front facet of the laser diode.

In accordance with another aspect of the invention, a rare-earth doped planar waveguide is formed on the common planar lightguide circuit receiving pump energy from the laser diode.

In accordance with another aspect of the invention, the rare-earth optical amplifier is a rare-earth doped fiber amplifier.

In accordance with another aspect of the invention, the rare-earth doped fiber amplifier is an erbium-doped fiber amplifier.

In accordance with another aspect of the invention, a method of operating a semiconductor laser is provided. The method begins by applying a first current to a first section of a laser diode for generating optical gain therein. A second current is applied to a second section of the laser diode for generating optical absorption therein so that a self-pulsating mode of laser operation arises. Finally, optical feedback is provided to the laser diode from an external reflector for generating lasing action.

In accordance with another aspect of the invention, the laser diode generates optical energy at a wavelength sufficient to pump a rare-earth doped optical amplifier.

In accordance with another aspect of the invention, the laser diode has an active region comprising a multi-quantum well region.

In accordance with another aspect of the invention, the external reflector comprises a Bragg grating optically coupled to an output facet of the laser diode for reflecting a portion of optical power back to an active region of the laser diode.

In accordance with another aspect of the invention, a ratio of the second current to the first current exceeds a relative amount of gain compression arising in the laser diode.

DETAILED DESCRIPTION

Figure 1:
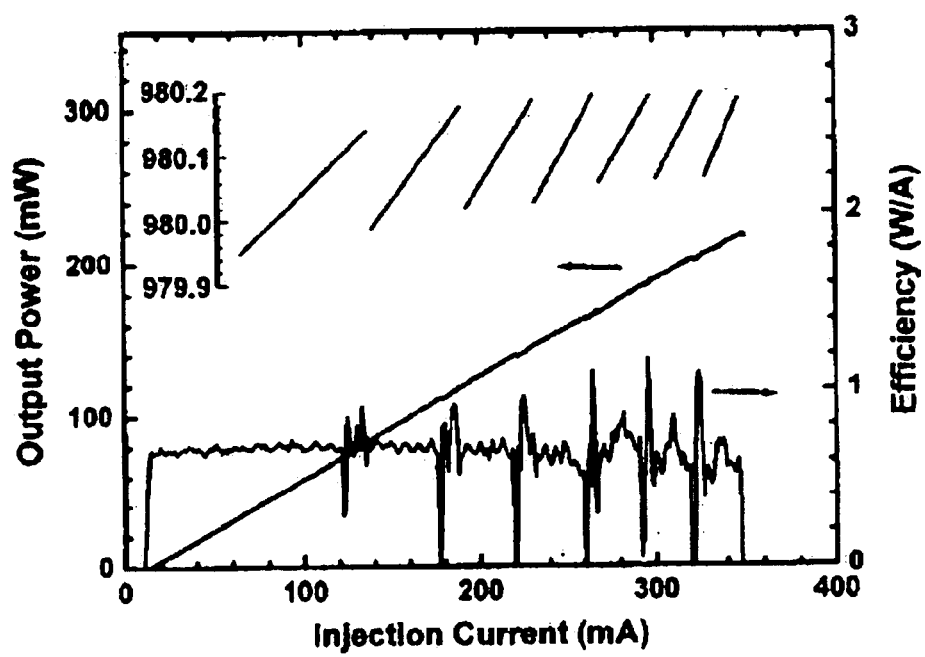
FIG. 1 shows the typical light power versus current and derivative efficiency curve for an FBG stabilized laser module.
Figure 2:
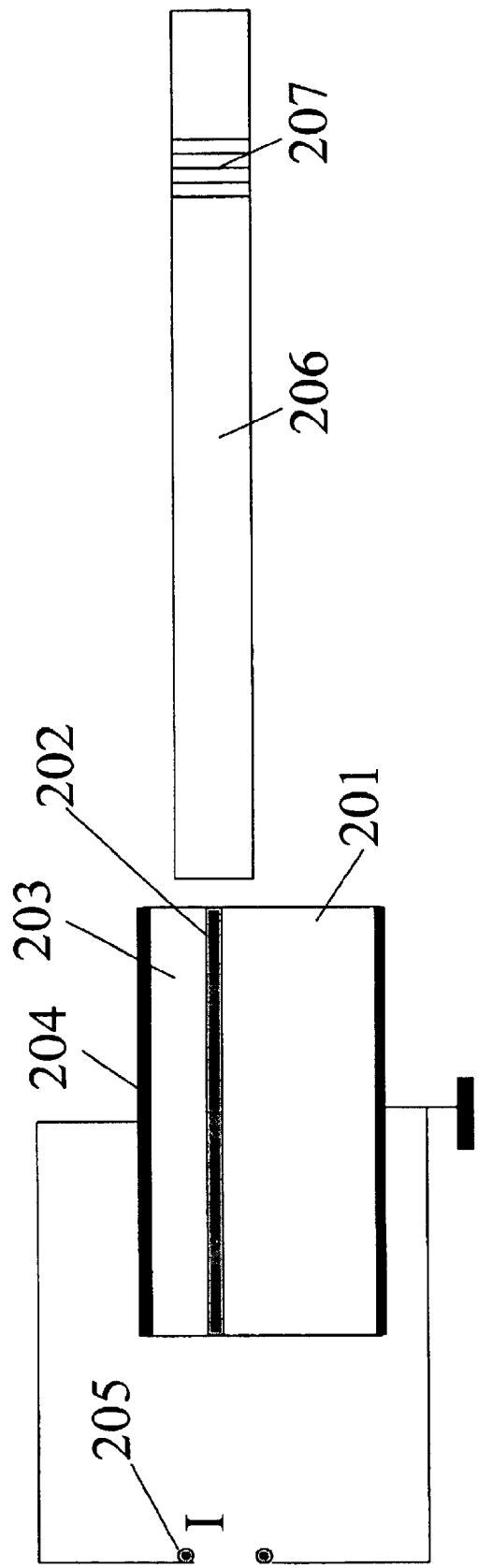
FIG. 2 is a schematic illustration of a prior-art diode laser coupled to an external fiber Bragg grating, which is remotely positioned so as to enable operation in the regime of 'coherence collapse'.

The present invention provides a laser source that eliminates the low power restriction imposed on the conventional arrangement depicted in FIG. 1 while maintaining multimode, and therefore, kink free operation at high power levels. This result is achieved by introducing separate gain and absorber sections into the active region of the laser diode, which thereby gives rise to a multimode operation induced by self-pulsation (see, for example, G. Pham and G-H Duan, "Self-Pulsation in Two-Section DFB Semiconductor Lasers and its Synchronization to an External Signal", IEEE J. Quantum Electronics Vol. 34, pp1000–1008). As discussed below, the present invention also allows the laser source to packaged in a compact manner. For example, the pump laser can be directly mounted on a planar lightguide circuit (PLC) chip that also includes one or more erbium doped waveguides.

PRINCIPLES OF THE INVENTION

The pump diode laser employed in the present invention consists of separate gain and the absorber sections together with a feedback grating. Under certain conditions, as set out below, this laser may be shown to possess an instability with respect to relaxation oscillations that result in self-pulsation and a multimode regime at high power. Two section lasers have been used previously for inducing mode locking at very high frequency and the relaxation oscillations of import for the present invention have been observed (Kam Y. Lau, "Dynamics of Quantum Well Lasers", Chap. 5 of "Quantum Well Lasers", ed. Peter S. Zory, Academic Press Inc. 1993).

In order to analyze the possibility of instability in a two-section laser we start with the basic equations of laser dynamics inside the active layer of the gain section, which involves a pair of rate equations governing the photon and carrier densities in the gain section (S and N, respectively) as follows (see Kam Y. Lau reference, above)

$$dN/dt = I_g/eV_g - N/\tau_s - vg(N,S)S, \quad (1)$$

$$dS/dt = \Gamma vg(N,S)S - S/\tau_p(P), \quad (2)$$

in which $\Gamma$ is the optical confinement factor, $I_g$ is the pump current, $V_g$ is the volume of the active layer, $\tau_s$ is the recombination life time, $v$ is the group velocity, $g(N,S)$ is the optical gain, viz.

$$g(N,S) = g(N)/(1+\epsilon S) \quad (3)$$

where $\epsilon$ is the gain compression factor, and $\tau_p(P)$ is photon lifetime, given by $$1/\tau_p(P) = v/L_g * ln(R_f R_b \exp(-\Gamma\alpha(P)L_a))^{-1} = v/L_g * ln(R_f R_b)^{-1} + v\Gamma\alpha(P)L_a/L_g, \quad (4)$$

where * implies multiplication, $R_b$ is the reflection coefficients of the laser back facet, $R_f$ is the combined reflection coefficients of the grating and the laser front facet, $L_g$ and $L_a$ are the lengths of the respective gain and absorber sections, and $\alpha(P) = -g(P)$ and P are respectively the absorption coefficient and carrier concentration of the active layer of absorption section, with $$dP/dt = -I_a(P)/eV_a - P/\tau_s + v\alpha(P)S \quad (5)$$

where $V_a = V_g L_a/L_g$ is the volume of absorber active layer. Since P is below the transparency concentration, $\alpha(P)$ is a positive quantity. Under stationary conditions $dN/dt = dS/dt = dP/dt = 0$, $$I_g = I_{g0} = (N_0/\tau_s + vg(N_0, S_0)S_0)*eV_g, \quad (6)$$

$$S = S_0, N = N_0, P = P_0, I_{a0} = I_a(P_0), \quad (6a)$$

$$\Gamma vg(N_0, S_0) - 1/\tau_p(P_0) = 0, \quad (7)$$

$$v\alpha(P_0)S_0 = I_{a0}/eV_a - P_0/\tau_s, \quad (8)$$

where $I_{a0}$ is a DC current in the absorber electrical circuit under reverse biased condition.

In order to investigate the stability of these stationary conditions, we consider the small signal responses s, n, and p, to a current perturbation $i(\omega) = i*\exp(j \omega t)$ in the form $$I_g = I_{g0} + i(\omega); S = S_0 + s; N = N_0 + n; P = P_0 + p. \quad (9)$$

Substituting (9) into equations (1), (2), (5) and using equations (6), (6a), (7) and (8) we obtain equations for the small deviations of light and carrier densities from their steady-state values as follows:

$$j\omega n = -n/\tau_s - vg_n(N_0)S_0*n - vg(N,S)s, \quad (10)$$

$$j\omega s = \Gamma vg_n(N_0)S_0*n - \epsilon S_0/\tau_p*s + \Gamma vg_n(P_0)S_0 L_a/L_g*p, \quad (11)$$

$$j\omega(1 - C/C_1)p = -p/\tau_s - vg_n(P_0)S_0*p + v\alpha(P_0)s, \quad (12)$$

where $C_1 = (dU/dP)^{-1}*eV_a \sim 100pF$, U is the difference between electron and hole Fermi levels, $g_n(N_0) = dg/dN$ at $N = N_0$, and $g_n(P_0) = -d\alpha(P)/dP = dg/dN$ at $N = P_0$.

Since carrier concentration in the absorber section is much smaller than that in the gain section we have $N_0 >> P_0$. Also, since g(N) is a strongly sub-linear function of N, it follows that $vg_n(P_0)S_0 >> vg_n(N_0)S_0 > 1/\tau_s$ (see Kam Y Lau reference, above). Using these relations and the conditions $C/C_1 = 1$, $I_a(P_0)/eV_a >> P_0/\tau_s$ we can obtain from (11), (12) and (8) the damped oscillator form $$s = \Gamma vg_n(N_0)S_0/[\omega^2 - j\omega\gamma - (2\pi f_r)^2], \quad (13)$$

in which the resonant frequency of relaxation oscillations $f_r$ is given by $$(2\pi f_r)^2 = vg_n(N_0)S_0/\tau_p(P_0) \quad (14)$$

and the associated damping rate by $$\gamma = (\epsilon S_0 - I_{a0}/I_{g0})/\tau_p(P_0) \quad (15)$$

If $\gamma$ is negative the pump laser exhibits self pulsations and, consequently, operates in a multi-longitudinal mode, kink free, regime. In this case, from (15), the fraction of the optical power consumed by the absorber, $I_{a0}/I_{g0}$, exceeds the fraction of optical power consumed by gain compression due to electron heating by optical field, $\epsilon S_0$. That is:

$$I_{a0}/I_{g0} > \epsilon S_0. \quad (16)$$

However, the relative amount of gain compression $\epsilon S_0$ is small compared to 1 ($\epsilon S_0 << 0.1$) even at very high optical power. It follows that the reduction of the pump laser quantum efficiency caused by the absorber section under self-pulsation can be made relatively small. On the other hand, the maximum optical power is limited only by heat sinking and can significantly exceed that of any conventional pump laser with wavelength stabilized by FBG.

ILLUSTRATIVE EMBODIMENT OF THE INVENTION

Figure 3:
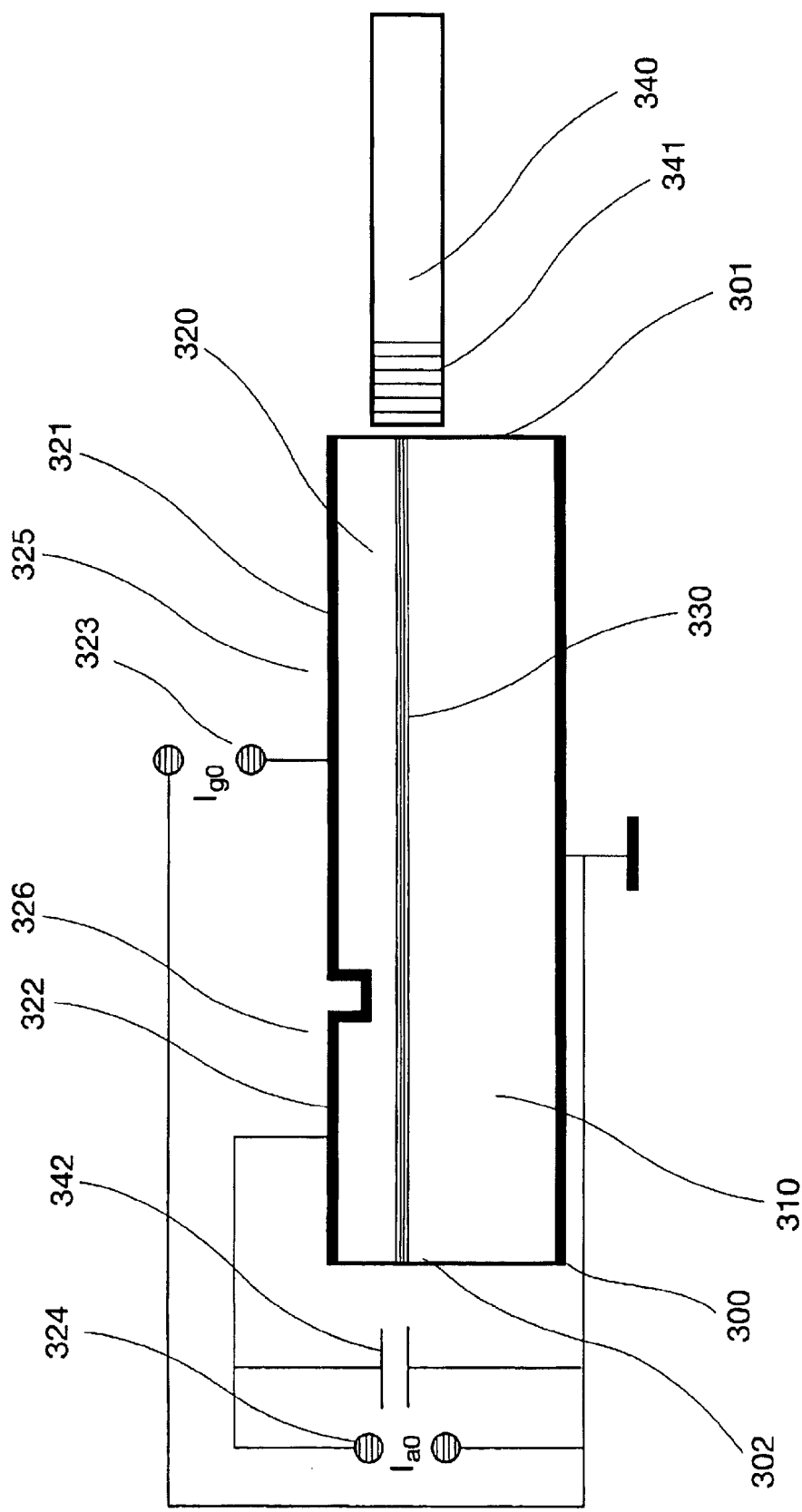
FIG. 3 is a schematic of a two-section semiconductor diode laser constructed in accordance with the present invention.

A schematic representation of the invention is depicted in FIG. 3. As shown, a laser source 300 such as a laser diode chip is optically coupled via its front facet 301 to an external waveguide structure 340 having a Bragg grating (BG) 341. The laser source 300 has an n-doped lower cladding layer 310, a p-doped upper cladding layer 320 and an active layer

330. The electrode of the upper cladding layer consists of two electrically isolated sections, a gain section 325 and an absorber section 326. The gain section is forward biased via electrical contact 321, and the absorber section is reversed biased via electrical contact 322. $I_{g0}$ and $I_{a0}$ from contacts 323 and 324 are electrical currents flowing through the gain and absorber sections respectively. The laser optical cavity extends between the laser chip back facet 302 and the combined reflector formed by front facet 301 and BG 341. The spectral width of the BG is chosen to be 5–6 spacing of the laser chip FP modes. As we discussed above, kink free operation of such a pump laser can be achieved in multi-FP mode operation. This, in turn, occurs when the laser exhibits self-pulsation due to relaxation operation instability. At high optical power, relaxation oscillations are mostly damped by the gain compression effect. On the other hand, the opposite effect is caused by partial bleaching of the absorber section, which overruns the first effect under the condition described by Eq.(16) of the previous section. The value C of the capacitor 342 is chosen as described in the same section.

A kink-free operation is maintained as long as Eq, (16) is satisfied. Thus the present invention provides a method for eliminating power restriction caused by kinks on LI curve, so that only thermal effects limit the output power. Secondly, the invention allows for compact packaging because the BG 341 can be placed much closer to the front facet 301 of the laser chip. For example, the pump laser can be mounted directly onto a planar waveguide circuit (PLC) chip on which erbium doped waveguides are located Thirdly, special wavelength stabilizing gratings are not by the present invention, since the proposed method works even with broadband external reflectors. Some applications of this invention include the ability to assemble compact stabilized pump packaged lasers without long fiber pigtails, integration of packaged pump laser diodes with PLC chips in small packages, and the ability to mount and couple unpackaged laser diodes directly onto PLC chips with the need for stabilizing external reflectors.

What is claimed is:

1. A semiconductor laser source, comprising:
   a laser diode generating optical energy at a wavelength sufficient to pump a rare-earth doped optical amplifier, said laser diode having front and rear facets that includes:
   a substrate;
   a lower cladding layer disposed on the substrate, said lower cladding layer being doped with a first conductivity type;
   an active layer disposed on the lower cladding layer;
   an upper cladding layer disposed on the active layer, said upper cladding layer being doped with a second conductivity type;
   at least one electrode disposed on a first outer layer of the diode;
   a pair of electrodes disposed on a second outer layer of the diode, the second outer layer being located on a side of the diode opposing the first outer layer, said pair of electrodes being configured to allow application of a first current to a first section of the laser diode for generating optical gain therein and a second current to a second section of the laser diode to produce instability in a single mode laser operation resulting in coherence collapse; and
   a reflector located external to the laser diode and in optical communication with the front facet of the laser diode for providing optical feedback to the active region.

2. The semiconductor laser source of claim 1 wherein a first portion of the active region between the at least one electrode and a first electrode in the pair of electrodes is forward biased to provide optical gain and a second portion of the active region between the at least one electrode and a second electrode in the pair of electrodes is reverse biased to provide optical absorption.

3. The semiconductor laser source of claim 2 wherein said reflector comprises a Bragg grating optically coupled to said output facet for reflecting a portion of optical power back to said active region.

4. The semiconductor laser source of claim 3, wherein a ratio of current applied to the second electrode to current applied to the first electrode exceeds a relative amount of gain compression arising in the laser diode.

5. The semiconductor laser source of claim 2 wherein a ratio of current applied to the second electrode to current applied to the first electrode exceeds a relative amount of gain compression arising in the laser diode.

6. The semiconductor laser source of claim 1 wherein the electrodes in the pair of electrodes are electrically isolated from one another by an electrical resistance greater than about 10 Ohms.

7. The semiconductor laser source of claim 1 wherein said active region comprises a multi-quantum well region.

8. The semiconductor laser source of claim 1 wherein said reflector comprises a Bragg grating optically coupled to said output facet for reflecting a portion of optical power back to said active region.

9. The semiconductor laser source of claim 1 wherein said pair of electrodes are disposed on the upper cladding layer.

10. The semiconductor laser source of claim 9 wherein said at least one electrode is disposed on the substrate.

11. The semiconductor laser source of claim 10 wherein said at least one electrode is a single, electrically continuous electrode.

12. The semiconductor laser source of claim 10 wherein said at least one electrode is a single, electrically continuous electrode.

13. The semiconductor laser source of claim 9 wherein said first conductivity type is n-type and said second conductivity type is p-type.

14. The semiconductor laser source of claim 9 wherein the laser diode and the reflector are located on a common planar lightguide circuit.

15. The semiconductor laser source of claim 14 further comprising a planar waveguide foamed on the common planar light circuit coupling the reflector to the front facet of the laser diode.

16. The semiconductor laser source of claim 15 further comprising a rare-earth doped planar waveguide formed on the common planar lightguide circuit receiving pump energy from the laser diode.

17. The semiconductor laser source of claim 1 further comprising a rare-earth optical amplifier receiving pump energy from the laser diode.

18. The semiconductor laser source of claim 17 wherein said rare-earth optical amplifier is a rare-earth doped fiber amplifier.

19. The semiconductor laser source of claim 18 wherein said rare-earth doped fiber amplifier is an erbium-doped fiber amplifier.

20. A method of reducing noise in a wavelength-stabilized semiconductor laser diode having an active multi-quantum well region with a gain section and an absorber section, said method comprising the steps of:
   applying a first current to the gain section of the laser diode for generating optical gain therein;
   applying a second current to the absorber section of the laser diode to produce instability in a single mode laser operation resulting in coherence collapse; and
   providing optical feedback to the laser diode from an external reflector for generating lasing action.

21. The method of claim 20 wherein said laser diode generates optical energy at a wavelength sufficient to pump a rare-earth doped optical amplifier.

22. The method of claim 21 wherein said external reflector comprises a Bragg grating optically coupled to an output facet of the laser diode for reflecting a portion of optical power bock to the active region of the laser diode.

23. The method of claim 20 wherein said external reflector comprises a Bragg grating optically coupled to an output facet of the laser diode for reflecting a portion of optical power back to the active region of the laser diode.

24. The method of claim 23 wherein a ratio of the second current to the first current exceeds a relative amount of gain compression arising in the laser diode.

25. The method of claim 20 wherein a ratio of the second current to the first current exceeds a relative amount of gain compression arising in the laser diode.

26. The method of claim 20 further comprising the step of supplying optical energy from the laser diode to a rare-earth doped optical amplifier.

27. The method of claim 26 wherein said rare-earth doped optical amplifier comprises a rare-earth doped planar waveguide located on a common planar lightguide circuit with the laser diode.

28. The method of claim 26 wherein said rare-earth doped optical amplifier is a rare-earth doped fiber amplifier.

29. A semiconductor laser source, comprising:
a laser diode having front and rear facets that includes:
a substrate;
a lower cladding layer disposed on the substrate, said lower cladding layer being doped with a first conductivity type;
an active layer disposed on the lower cladding layer and comprising said active region comprising a multi-quantum well region;
an upper cladding layer disposed on the active layer, said upper cladding layer being doped with a second conductivity type;
at least one electrode disposed on a first outer layer of the diode;
a pair of electrodes disposed on a second outer layer of the diode, the second outer layer being located on a side of the diode opposing the first outer layer, said pair of electrodes being configured to allow application of a first current to a first section of the laser diode for generating optical gain therein and a second current to a second section of the laser diode to produce instability in a single mode laser operation resulting in coherence collapse; and
a reflector located external to the laser diode and in optical communication with the front facet of the laser diode for providing optical feedback to the active region.

30. The semiconductor laser source of claim 29 wherein a first portion of the active region between the at least one electrode and a first electrode in the pair of electrodes is forward biased to provide optical gain and a second portion of the active region between the at least one electrode and a second electrode in the pair of electrodes is reverse biased to provide optical absorption.

31. The semiconductor laser source of claim 30 wherein said reflector comprises a Bragg grating optically coupled to said output facet for reflecting a portion of optical power back to said active region.

32. The semiconductor laser source of claim 31 wherein a ratio of current applied to the second electrode to current applied to the first electrode exceeds a relative amount of gain compression arising in the laser diode.

33. The semiconductor laser source of claim 30 wherein said second portion of the active region is reverse-biased to produce instability in a single mode laser operation resulting in self-pulsation.

34. The semiconductor laser source of claim 30 wherein a ratio of current applied to the second electrode to current applied to the first electrode exceeds a relative amount of gain compression arising in the laser diode.

35. The semiconductor laser source of claim 29 wherein the electrodes in the pair of electrodes are electrically isolated from one another by an electrical resistance greater than about 10 Ohms.

36. The semiconductor laser source of claim 29 wherein said laser diode generates optical energy at a wavelength sufficient to pump a rare-earth doped optical amplifier.

37. The semiconductor laser source of claim 29 wherein said reflector comprises a Bragg grating optically coupled to said output facet for reflecting a portion of optical power back to said active region.

38. The semiconductor laser source of claim 29 wherein said pair of electrodes are disposed on the upper cladding layer.

39. The semiconductor laser source of claim 38 wherein said at least one electrode is disposed on the substrate.

40. The semiconductor laser source of claim 38 wherein said first conductivity type is n-type and said second conductivity type is p-type.

41. The semiconductor laser source of claim 38 wherein the laser diode and the reflector are located on a common planar lightguide circuit.

42. The semiconductor laser source of claim 41 further comprising a planar waveguide formed on the common planar light circuit coupling the reflector to the front facet of the laser diode.

43. The semiconductor laser source of claim 42 further comprising a rare-earth doped planar waveguide formed on the common planar lightguide circuit receiving pump energy from the laser diode.

44. The semiconductor laser source of claim 29 further comprising a rare-earth optical amplifier receiving pump energy from the laser diode.

45. The semiconductor laser source of claim 44 wherein said rare-earth optical amplifier is a rare-earth doped fiber amplifier.

46. The semiconductor laser source of claim 45 wherein said rare-earth doped fiber amplifier is an erbium-doped fiber amplifier.

47. A semiconductor laser source, comprising:
a laser diode having front and rear facets that includes:
a substrate;
a lower cladding layer disposed on the substrate, said lower cladding layer being doped with a first conductivity type;
an active layer disposed on the lower cladding layer;
an upper cladding layer disposed on the active layer, said upper cladding layer being doped with a second conductivity type;
at least one electrode disposed on a first outer layer of the diode;
a pair of electrodes disposed on a second outer layer of the diode, the second outer layer being located on a side of the diode opposing the first outer layer, said pair of electrodes being configured to allow application of a first current to a first section of the laser diode for generating optical gain therein and a second current to a second section of the laser diode to produce instability in a single mode laser operation resulting in coherence collapse; and
a reflector located external to the laser diode and in optical communication with the front facet of the laser diode for providing optical feedback to the active region, said reflector including a Bragg grating optically coupled to said output facet for reflecting a portion of optical power back to said active region; and wherein a first portion of the active region between the at least one electrode and a first electrode in the pair of electrodes is forward biased to provide optical gain and a second portion of the active region between the at least one electrode and a second electrode in the pair of electrodes is reverse biased to provide optical absorption.

48. The semiconductor laser source of claim 47 wherein the electrodes in the pair of electrodes are electrically isolated from one another by an electrical resistance greater than about 10 Ohms.

49. The semiconductor laser source of claim 47 wherein said active region comprises a multi-quantum well region.

50. The semiconductor laser source of claim 47 wherein said reflector comprises a Bragg grazing optically coupled to said output facet for reflecting a portion of optical power back to said active region.

51. The semiconductor laser source of claim 50 wherein a ratio of current applied to the second electrode to current applied to the first electrode exceeds a relative amount of gain compression arising in the laser diode.

52. The semiconductor laser source of claim 47 wherein said second portion of the active region is reverse-biased to produce instability in a single mode laser operation resulting in self-pulsation.

53. The semiconductor laser source of claim 47 wherein a ratio of current applied to the second electrode to current applied to the first electrode exceeds a relative amount of gain compression arising in the laser diode.

54. The semiconductor laser source of claim 47 wherein said pair of electrodes are disposed on the upper cladding layer.

55. The semiconductor laser source of claim 54 wherein said at least one electrode is disposed on the substrate.

56. The semiconductor laser source of claim 55 wherein said at least one electrode is a single, electrically continuous electrode.

57. The semiconductor laser source of claim 54 wherein said first conductivity type is n-type and said second conductivity type is p-type.

58. The semiconductor laser source of claim 54 wherein the laser diode and the reflector are located on a common planar lightguide circuit.

59. The semiconductor laser source of claim 58 further comprising a planar waveguide formed on the common planar light circuit coupling the reflector to the front facet of the laser diode.

60. The semiconductor laser source of claim 59 further comprising a rare-earth doped planar waveguide formed on the common planar lightguide circuit receiving pump energy from the laser diode.

61. The semiconductor laser source of claim 47 further comprising a rare-earth optical amplifier receiving pump energy from the laser diode.

62. The semiconductor laser source of claim 61 wherein said rare-earth optical amplifier is a rare-earth doped fiber amplifier.

63. The semiconductor laser source of claim 62 wherein said rare-earth doped fiber amplifier is an erbium-doped fiber amplifier.

64. A method of reducing noise in a wavelength-stabilized semiconductor laser diode having an active region with a gain section and an absorber section, said method comprising the steps of:

applying a first current to die gain section of the laser diode for generating optical gain therein;

applying a second current to the absorber section of the laser diode to produce instability in a single mode laser operation resulting in coherence collapse; and providing optical feedback to the laser diode from an external reflector for generating lasing action, wherein said external reflector includes a Bragg grating optically coupled to an output facet of the laser diode for reflecting a portion of optical power back to the active region of the laser diode.

65. The method of claim 64 wherein said laser diode generates optical energy at a wavelength sufficient to pump a rare-earth doped optical amplifier.

66. The method of claim 65 wherein a ratio of the second current to the first current exceeds a relative amount of gain compression arising in the laser diode.

67. The method of claim 64 wherein said active region comprise a multi-quantum well region.

68. The method of claim 64 wherein a ratio of the second current to the first current exceeds a relative amount of gain compression arising in the laser diode.

69. The method of claim 64 further comprising the step of supplying optical energy from the laser diode to a rare-earth doped optical amplifier.

70. The method of claim 69 wherein said rare-earth doped optical amplifier comprises a rare-earth doped planar waveguide located on a common planar lightguide circuit with the laser diode.

71. The method of claim 69 wherein said rare-earth doped optical amplifier is a rare-earth doped fiber amplifier.

72. A method of reducing noise in a wavelength-stabilized semiconductor laser diode having an region with a gain section and an absorber section, said method comprising the steps of:

applying a first current to the gain section of the laser diode for generating optical gain therein;

applying a second current to the absorber section of the laser diode to produce instability in a single mode laser operation resulting in coherence collapse; and providing optical feedback to the laser diode from an external reflector for generating lasing action; and supplying optical energy from the laser diode to a rare-earth doped optical amplifier.

73. The method of claim 72 wherein said laser diode generates optical energy at a wavelength sufficient to pump a rare-earth doped optical amplifier.

74. The method of claim 73 wherein said external reflector comprises a Bragg grating optically coupled to an output facet of the laser diode for reflecting a portion of optical power back to the active region of the laser diode.

75. The method of claim 72 wherein said external reflector comprises a Bragg grating optically coupled to an output facet of the laser diode for reflecting a portion of optical power back to the active region of the laser diode.

76. The method of claim 75 wherein a ratio of the second current to the first current exceeds a relative amount of gain compression arising in the laser diode.

77. The method of claim 72 wherein a ratio of the second current to the first current exceeds a relative amount of gain compression arising in the laser diode.

78. The method of claim 72 wherein said rare-earth doped optical amplifier comprises a rare-earth doped planar waveguide located on a common planar lightguide circuit with the laser diode.

79. The method of claim 72 wherein said rare-earth doped optical amplifier is a rare-earth doped fiber amplifier.

* * * * *

UNITED STATES PATENT AND TRADEMARK OFFICE
CERTIFICATE OF CORRECTION

PATENT NO.        : 6,882,666 B2
APPLICATION NO. : 10/277999
DATED              : April 19, 2005
INVENTOR(S)      : Rudolf Kazarinov et al.

It is certified that error appears in the above-identified patent and that said Letters Patent is hereby corrected as shown below:

Specification, Col. 2, line 7, after "larger," change "that" to -- than --.

Specification, Col. 2, line 39, before "more", delete "a".

Specification, Col. 5, line 11, before "packaged", insert -- be --.

Specification, Col. 5, line 19, before "absorber", delete -- the --.

Specification, Col. 7, line 28, after "located", insert -- . --.

Specification, Col. 7, line 29, after "not", insert -- required --.

Specification, Col. 7, line 35, after "chips", change "with" to -- without --.

Claim 15, Col. 8, line 41, after "waveguide", change "foamed" to -- formed --.

Claim 50, Col. 11, line 18, after "Bragg", change "grazing" to -- grating --.

Claim 64, Col. 11, line 66, after "to", change "die" to -- the --.

Claim 67, Col. 12, line 17, first word, change "comprise" to -- comprises --.

Claim 72, Col. 12, line 31, after "having", change "an" to -- a --.

Signed and Sealed this

Sixth Day of May, 2008

JON W. DUDAS
*Director of the United States Patent and Trademark Office*